(12) United States Patent
Nakata

(10) Patent No.: US 8,362,495 B2
(45) Date of Patent: Jan. 29, 2013

(54) ROD-SHAPED SEMICONDUCTOR DEVICE

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 0 days.

(21) Appl. No.: 13/136,479

(22) Filed: Aug. 2, 2011

(65) Prior Publication Data

US 2011/0297968 A1 Dec. 8, 2011

Related U.S. Application Data

(62) Division of application No. 12/227,414, filed as application No. PCT/JP2006/311936 on Jun. 14, 2006, now Pat. No. 8,053,788.

(51) Int. Cl.
H01L 27/15 (2006.01)
H01L 29/267 (2006.01)
H01L 31/12 (2006.01)
H01L 33/00 (2010.01)

(52) U.S. Cl. ...................... 257/81; 257/84; 257/E31.032

(58) Field of Classification Search .................... 257/81, 257/84, E31.032
See application file for complete search history.

(56) References Cited

U.S. PATENT DOCUMENTS

| 3,984,256 A | 10/1976 | Fletcher et al. |
| 5,342,453 A | 8/1994 | Olson |
| 5,431,741 A | 7/1995 | Sakaguchi et al. |
| 5,437,736 A | 8/1995 | Cole |
| 6,204,545 B1 | 3/2001 | Nakata |
| 6,744,073 B1 * | 6/2004 | Nakata .......................... 257/81 |
| 7,205,626 B1 | 4/2007 | Nakata |
| 2004/0238833 A1 | 12/2004 | Nakata |
| 2005/0067622 A1 | 3/2005 | Nakata |
| 2005/0127379 A1 | 6/2005 | Nakata |
| 2006/0086384 A1 | 4/2006 | Nakata |

FOREIGN PATENT DOCUMENTS

| EP | 0 601 613 | 6/1994 |
| FR | 2 327 643 | 5/1977 |
| FR | 2417188 | 9/1979 |
| WO | WO-02/35612 | 5/2002 |
| WO | WO-02/35613 | 5/2002 |
| WO | WO-03/017382 | 2/2003 |
| WO | WO-03/017383 | 2/2003 |
| WO | WO-03/036731 | 5/2003 |
| WO | WO-04/001858 | 12/2003 |

* cited by examiner

Primary Examiner — Matthew Landau
Assistant Examiner — Vicki B Booker
(74) Attorney, Agent, or Firm — Jordan and Hamburg LLP

(57) ABSTRACT

A rod-shaped semiconductor device having a light-receiving or light-emitting function is equipped with a rod-shaped substrate made of p-type or n-type semiconductor crystal, a separate conductive layer which is formed on a part of the surface of the substrate excluding a band-shaped part parallel to the axis of the substrate and has a different conduction type from the conduction type of the substrate, a pn-junction formed with the substrate and separate conductive layer, a band-shaped first electrode which is formed on the surface of the band-shaped part on the substrate and ohmic-connected to the substrate, and a band-shaped second electrode which is formed on the opposite side of the first electrode across the shaft of said substrate and ohmic-connected to the separate conductive layer.

11 Claims, 13 Drawing Sheets

ROD-SHAPED SEMICONDUCTOR DEVICE

This is a Divisional Application of U.S. Ser. No. 12/227,414 filed Nov. 17, 2008.

TECHNICAL FIELD

The present invention relates to a semiconductor device, especially a semiconductor device which is made of a rod-shaped semiconductor crystal and has a light-receiving or light-emitting function.

BACKGROUND OF THE INVENTION

The inventor of the present application proposed, in U.S. Pat. No. 6,204,545, a spherical semiconductor element which has a light-receiving or light-emitting function, wherein a spherical pn-junction is formed near the surface of a spherical semiconductor crystal, and dot-shaped positive and negative electrodes are formed at both ends across the center of the spherical crystal. The semiconductor element has optical symmetry in other directions than the axial direction connecting the pair of electrodes, and has the advantage that it can receive light three-dimensionally from various directions and emit light three-dimensionally in various directions.

The inventor of the present application proposed, in International Laid-Open Patent Application WO03/017382, a spherical semiconductor device which is nearly the same semiconductor element as said semiconductor element, wherein one electrode is formed on a flat surface with a part of an apex of a spherical semiconductor crystal removed, and the other electrode is formed on the opposite side of the electrode across the center of the semiconductor crystal.

A light-receiving or light-emitting module is obtained by arranging such spherical semiconductor elements in a planar matrix form with many rows and columns, serially connecting multiple semiconductor elements in each column, and connecting in parallel multiple semiconductor elements in each row. The larger the light-receiving area or light-emitting area of the module is made, the larger the number of connecting points at which the semiconductor element is electrically connected becomes.

The inventor of the present application proposed, in International Laid-Open Patent Application WO02/35612, a spherical semiconductor device which is nearly the same semiconductor element as said semiconductor element, wherein a pair of flat surfaces are formed by removing both ends across the center of a spherical semiconductor crystal, a pn-junction is formed near the surface including one flat surface of the semiconductor crystal, and positive and negative electrodes are formed on the one flat surface and the other flat surface.

In addition, proposed in International Laid-Open Patent Application WO02/35612 is a rod-shaped semiconductor element which has a light-receiving or light-emitting function, wherein a pair of end surfaces is formed perpendicular to the shaft on a columnar semiconductor crystal, a pn-junction is formed near the surface of the semiconductor crystal including one end surface, and positive and negative electrodes are formed on both of the end surfaces. The rod-shaped semiconductor element has an optical symmetry in other directions than the axial direction connecting the pair of electrodes, and has an advantage that it can receive light three-dimensionally from various directions and emit light three-dimensionally in various directions.

In the photovoltaic array described in U.S. Pat. No. 3,984,256, an n-type diffusion layer is formed on the surface of a filament made of p-type silicon semiconductor of 0.001~0.010 inches in diameter, a plural number of this filament are arranged in parallel and in a planar form, multiple P-connection line members and N-connection line members are alternately placed orthogonally on the top of these filaments, the P-connection line member is ohmic-connected to the exposed part of the p-type silicon semiconductor of multiple filaments, the N-connection line member is ohmic-connected to the n-type diffusion layer of multiple filaments, multiple P-connection line members are connected to a P bus, and multiple N-connection line members are connected to an N bus. An insulating fiber with a superior strength is woven in so as to constitute multiple P buses and N buses and a mesh, thus constituting a flexible solar battery blanket which generate electricity by receiving incident light from its top surface.

In the semiconductor fiber solar battery and module described in U.S. Pat. No. 5,437,736, a molybdenum conductive layer is formed on the surface of an insulating fiber, two layers of p-type and n-type thin-film semiconductor layers having a photovoltaic function and a ZnO conductive layer are formed on approximately $\frac{3}{5}$ of the periphery of the surface of this conductive layer, a plural number of these semiconductor fiber solar batteries are arranged in parallel and in a planar form, a metal coating is formed on its backside, after which the metal coating is partially removed in a specified pattern, thus forming a connection circuit which performs tasks such as serially connecting multiple semiconductor fiber solar batteries.

Patent Document 1: U.S. Pat. No. 6,204,545.
Patent Document 2: International Laid-Open Patent Application WO03/017382.
Patent Document 3: International Laid-Open Patent Application WO02/35612.
Patent Document 4: U.S. Pat. No. 3,984,256.
Patent Document 5: U.S. Pat. No. 5,437,736.

In manufacturing a solar battery panel using spherical semiconductor elements, a near-spherical semiconductor elements with a flat surface formed on a part of each, or near-spherical semiconductor elements with a pair of flat surfaces formed, the number of connecting points which electrically connect the semiconductor elements increases, the structure of a conductive connection mechanism which electrically connects the semiconductor elements becomes complex, and its manufacturing cost increases.

Because said rod-shaped semiconductor element also has a granular shape, in manufacturing a solar battery panel, the number of connecting points which electrically connect the semiconductor elements increases, the structure of a conductive connection mechanism which electrically connects the semiconductor elements becomes complex, and its manufacturing cost increases.

Furthermore, because a pair of electrodes are formed on both end surfaces perpendicular to the shaft, if the length of the rod-shaped semiconductor element is made large, the distance between the positive and negative electrodes increases, and the electrical resistance between the positive and negative electrodes increases. Therefore, the rod-shaped semiconductor element is not fit for manufacturing a semiconductor element having a length multiple times that of the diameter.

Because the photovoltaic array described in U.S. Pat. No. 3,984,256 has a construction wherein light enters from the top in the same manner as solar battery panels installed near-horizontally, it cannot receive light entering from both sides of the panel. This is also true with the semiconductor fiber solar battery in U.S. Pat. No. 5,437,736.

Especially, in a solar battery panel embedded in a window glass for example, it is desired that it be able to receive light from both sides. On the other hand, in constructing a light-emitting panel with semiconductor elements having a light-emitting function, it is desirable that light can be emitted to both sides of the panel.

SUMMARY OF THE INVENTION

Objectives of the present invention include providing a rod-shaped semiconductor element which has a light-receiving or light-emitting function and can increase the light-receiving area without increasing the inter-electrode distance, providing a rod-shaped semiconductor element which has a large length/diameter ratio and can reduce the number of electrical connecting parts in making a panel of multiple semiconductor elements, providing a rod-shaped semiconductor element which is hard to roll, providing a rod-shaped semiconductor element wherein polarity of each electrode is easy to identify, and so on.

The rod-shaped semiconductor device of the present invention, having a light-receiving or light-emitting function, comprises a rod-shaped substrate made of p-type or n-type semiconductor crystal having a circular cross section or near-circular cross section, a separate conductive layer which is formed on a part of a surface of the substrate excluding a band-shaped part parallel to an axis of the substrate and has a different conduction type from that of the conduction type of the substrate, a near-cylindrical pn-junction formed with the substrate and the separate conductive layer, a band-shaped first electrode which is ohmic-connected to a surface of the band-shaped part of the substrate, and a band-shaped second electrode ohmic-connected to the separate conductive layer on an opposite side of the first electrode across the axis of the substrate. The separate conductive layer may be formed by diffusion, film formation, or ion injection.

If the rod-shaped semiconductor device has a light-receiving function, when sunlight is received, it generates a photovoltaic power of a specified voltage by its pn-junction, and outputs it between the first and second electrodes. Because it has a light-receiving symmetry about a plane which includes the first and second electrodes, light beams entering from both sides of the plane are received to generate electric power. If a large number of rod-shaped semiconductor devices are arranged in a panel shape and a circuit to extract the output is formed, it becomes a solar battery panel (solar battery module).

If the rod-shaped semiconductor device has a light-emitting function, when a specified voltage is applied between the first and second electrodes, light corresponding to the band-gap energy from the pn-junction is emitted from the pn-junction. If a large number of rod-shaped semiconductor devices are arranged in a panel shape and a circuit to apply a voltage is formed, it becomes a light-emitting panel (light-emitting module).

According to the rod-shaped semiconductor device of the present invention, because band-shaped first and second electrodes connected to the surface of a band-shaped part of a rod-shaped substrate and a separate conductive layer are installed, even when the length/diameter ratio of the substrate is increased, the distance between the first and second electrodes can be maintained smaller than the diameter of the substrate, and the electrical resistance between the first and second electrodes can be maintained small. Therefore, power generating performance or light-emitting performance in the pn-junction can be maintained high.

As a result, in constructing a light-receiving or light-emitting panel, the light-receiving area of each semiconductor device is increased by increasing the length/diameter ratio of the substrate, and the number of electrical connecting parts for wiring the semiconductor devices can be decreased, making it possible to improve the reliability of the panel and reduce the manufacturing cost. Furthermore, because there is a light-receiving or light-emitting symmetry about a plane including the first and second electrodes, it is possible to construct a light-receiving panel which can receive light from both sides of the panel or a light-emitting panel which can emit light from both sides of the panel.

As the constitutions of dependent claims of the present invention, various kinds of constitutions such as the following may be adopted.

(1) A band-shaped apex of the substrate is removed to form a band-shaped flat surface, and on this flat surface the band-shaped part is formed, not only making it a rod-shaped semiconductor element which is hard to roll, but also making it possible to easily identify the polarities of the first and second electrodes.

(2) An antireflective film is formed on a part of the surfaces of the substrate and separate conductive layer excluding the first and second electrodes.

(3) The substrate is made of p-type Si single-crystal or Si polycrystalline, and the separate conductive layer is made of an n-type conductive layer containing P, Sb, or As.

(4) The substrate is made of n-type Si single-crystal or Si polycrystalline, and the separate conductive layer is constituted of a p-type conductive layer containing B, Ga, or Al.

(5) The device is constructed to be a light-receiving device which receives light and generates electricity.

(6) The substrate is made of n-type GaP single crystal or GaAs single crystal, and the separate conductive layer is constituted of an n-type diffusion layer wherein Zn is thermally diffused, which constitutes a light-emitting diode.

(7) The substrate is made of n-type GaAs single crystal, and the separate conductive layer is formed by diffusion, film-forming, or ion-injection of p-type GaAs, which constitutes a light-emitting diode.

(8) The substrate is made of n-type SiC single crystal, and the separate conductive layer is formed by forming a p-type GaN, GaInP, or P film, which constitutes a light-emitting diode.

(9) The area of the pn-junction is set larger than the area of a cross section perpendicular to the axis of the substrate.

Figure 1:
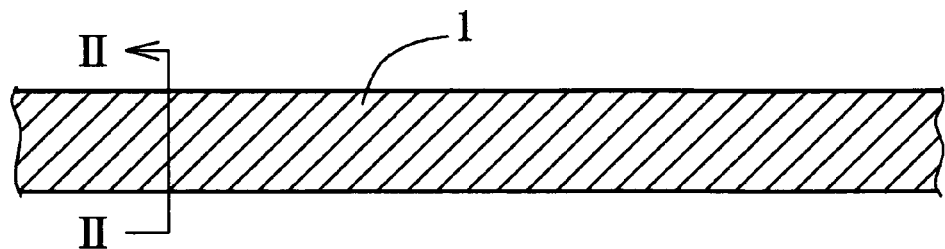
FIG. 1 is a cross-sectional view of a silicon single crystal body of Embodiment 1.

DESCRIPTION OF NUMERALS 1 silicon single crystal body
2, 2B flat surface
3A, 3B substrate
5, 5B diffusion layer
6, 6B pn-junction
8 antireflective film
8B passivation coating
9A positive electrode
9B negative electrode
10A negative electrode
10B positive electrode
20 light-receiving semiconductor device (solar battery cell)
20B light-emitting semiconductor device (light-emitting diode)

DESCRIPTION OF THE PREFERRED EMBODIMENTS

The rod-shaped semiconductor device of the present invention, having a light-receiving or light-emitting function, comprises a rod-shaped substrate made of p-type or n-type semiconductor crystal, a separate conductive layer which is formed on a part of a surface of the substrate excluding a band-shaped part parallel to the axis of the substrate and has a different conduction type from that of the substrate, a pn-junction formed with the substrate and the separate conductive layer, a band-shaped first electrode which is formed on the surface of the band-shaped part of the substrate and ohmic-connected to the substrate, and a band-shaped second electrode which is formed on the opposite side of the first electrode across the axis of the substrate and ohmic-connected to the separate conductive layer.

Embodiment 1

An embodiment of the present invention will be explained based on the drawings.

Figure 17:
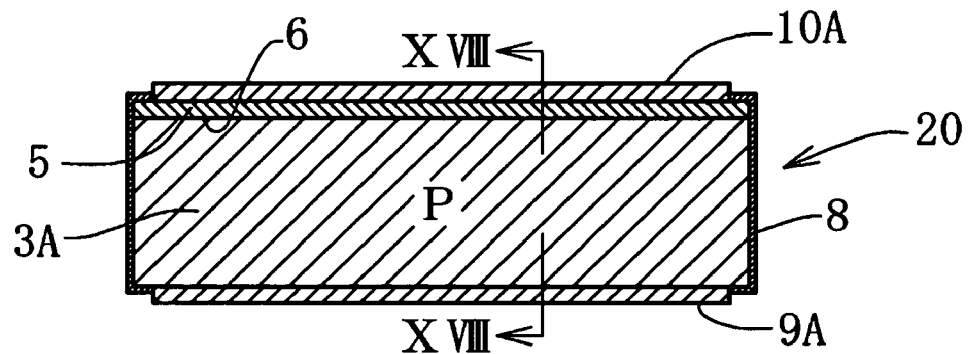
FIG. 17 is a cross-sectional view of a semiconductor device (solar battery cell).
Figure 18:
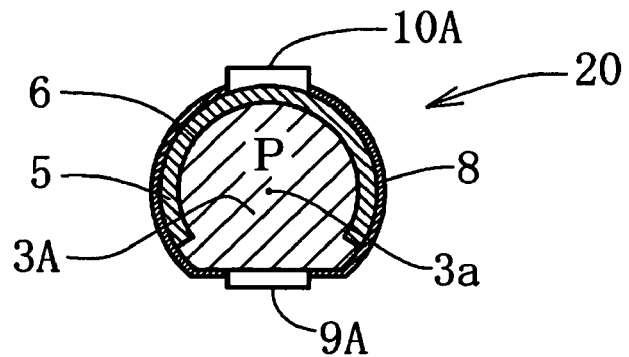
FIG. 18 is a cross-sectional view of the XVIII-XVIII line in FIG. 17.

The rod-shaped semiconductor device 20 (see FIGS. 17 and 18) of the present invention is a rod-shaped semiconductor device (solar battery cell) having a light-receiving function. The structure of this rod-shaped semiconductor device 20 will be explained while explaining its manufacturing method.

Figure 2:
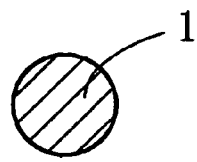
FIG. 2 is a cross-sectional view of the II-II line in FIG. 1.

As illustrated in FIGS. 1 and 2, first manufactured is a rod-shaped silicon single crystal body 1 which is similar to a line member of a small diameter. The diameter of this silicon single crystal body 1 is about 2.0 mm for example, and the length of the silicon single crystal body 1 is 60~300 mm. In manufacturing this silicon single crystal body 1, molten silicon is extracted through a small-diameter hole on the bottom of a crucible made of graphite or quartz. When starting this extraction, a small piece of silicon single crystal is used as a seed crystal to manufacture the silicon single crystal body 1 of a small-diameter rod shape continued from the seed crystal. This kind of manufacturing method of the rod-shaped single crystal body 1 is described in a literature such as Jpn. Appl. Phys. Vol. 35 (1996) pp. L793-795.

Figure 3:
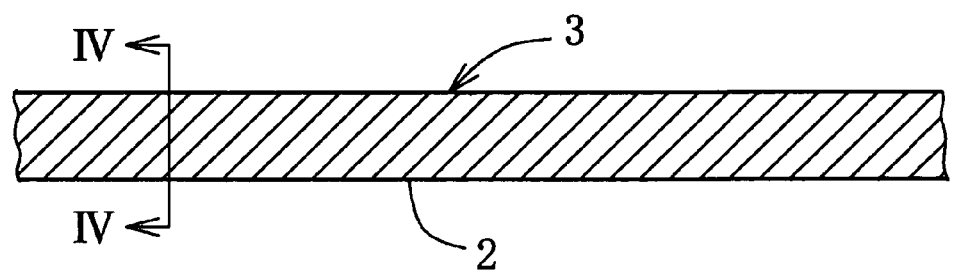
FIG. 3 is a cross-sectional view of a continuous substrate with a flat surface formed.
Figure 4:
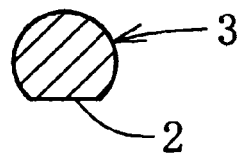
FIG. 4 is a cross-sectional view of the IV-IV line in FIG. 3.

Next, as illustrated in FIGS. 3 and 4, by polishing the silicon single crystal body 1 using a polishing machine and an appropriate abrasive material, it is made into a rod-shaped silicon single crystal body having a perfectly circular cross section perpendicular to the axis and a diameter of 1.8 mm, and a band-shaped flat surface 2 of 0.6 mm in width for example extending over the entire length is formed by polish-removing a band-shaped part on one spot in the circumference direction. In this manner, a rod-shaped continuous substrate 3 made of p-type silicon single crystal is manufactured. This flat surface 2 will be utilized in later processes as a reference surface for positioning and as a surface to prevent the continuous substrate 3 from rolling, and further utilized for identifying the polarities of positive and negative electrodes 9A and 10A described later.

Figure 5:
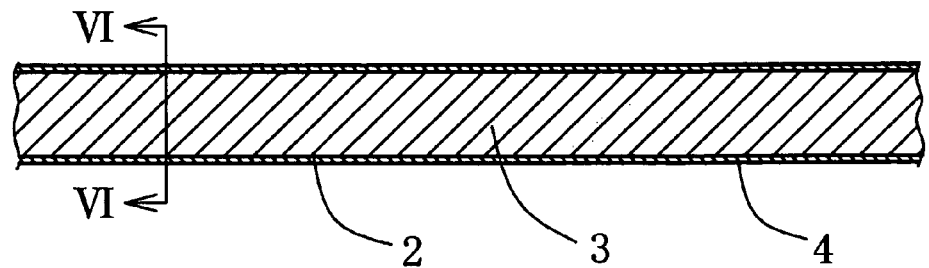
FIG. 5 is a cross-sectional view of a continuous substrate with a thermally-oxidized film formed.
Figure 6:
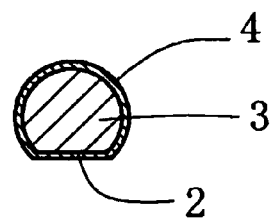
FIG. 6 is a cross-sectional view of the VI-VI line in FIG. 5.

Next, the continuous substrate 3 is thermally processed in an oxygen-containing gas using a publicly-known method to form a thermally-oxidized film 4 as illustrated in FIGS. 5 and 6 over the entire surface of the continuous substrate 3. A part of this thermally-oxidized film 4 will be used as a diffusion mask 4a in thermally diffusing an n-type impurity in the later diffusion process.

Figure 7:
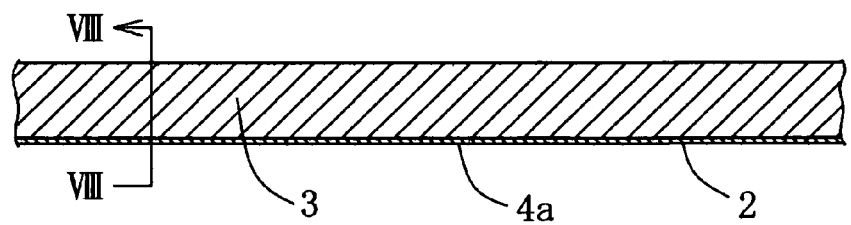
FIG. 7 is a cross-sectional view of a continuous substrate with a diffusion mask formed.
Figure 8:
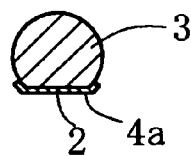
FIG. 8 is a cross-sectional view of the VIII-VIII line in FIG. 7.
Figure 9:
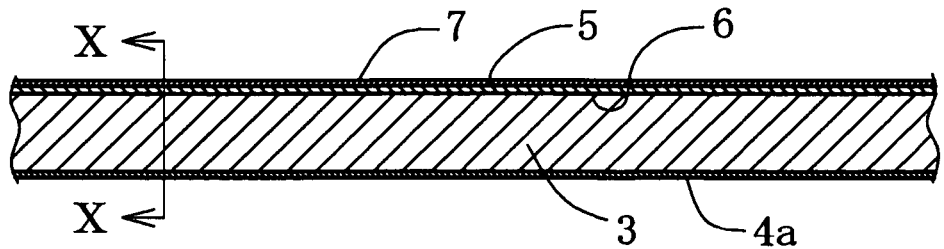
FIG. 9 is a cross-sectional view of a continuous substrate with a diffusion layer and a pn-junction formed.
Figure 10:
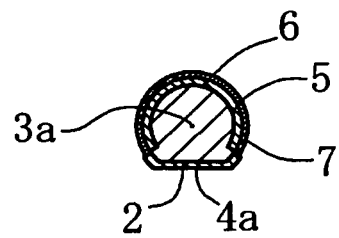
FIG. 10 is a cross-sectional view of the X-X line in FIG. 9.

Next, a part of the thermally-oxidized film on the flat surface 2 and its both sides of the continuous substrate 3 are covered with wax for example, and the other part of the thermally-oxidized film 4 not covered with wax is removed through an etching process using a fluoride solution by a publicly-known method, forming a band-shape diffusion mask 4a as illustrated in FIGS. 7 and 8. Next, in the diffusion process as illustrated in FIGS. 9 and 10, an n-type impurity phosphorus (P), arsenic (As), or antimony (Sb) is thermally diffused to form an n-type diffusion layer 5 of 0.5~1.0 μm in thickness (this corresponds to the separate conductive layer of a different conduction type from the conduction type of the substrate) on the part of the surface of the continuous substrate 3 excluding the band-shaped part masked with the diffusion mask 4a, forming a near-cylindrical pn-junction 6.

This pn-junction 6 has a partial cylindrical shape (partial cylinder with a C-shaped cross section), which is a cylinder having as a center the axis 3a of the continuous substrate 3 excluding the flat surface 2 and the adjacent parts on both sides of it. Whereas a silicon oxide film 7 containing phosphorus formed during the phosphorus diffusion process gets impurities such as cupper, iron, and gold (these reduce the lifetimes of carriers) during the thermal diffusion of phosphorus, because it has hygroscopicity, it is once completely removed through an etching process with a publicly-known etchant. In doing so, the diffusion mask 4a is also removed.

Figure 11:
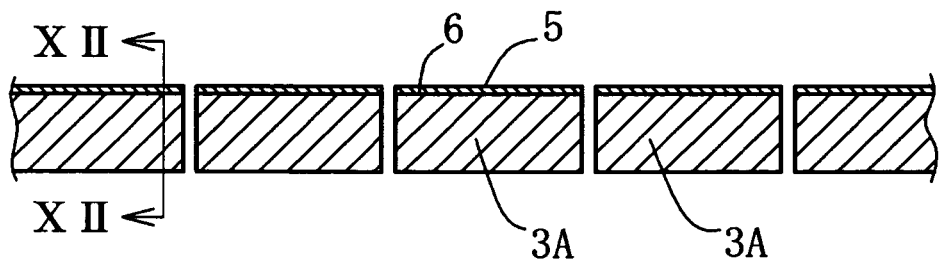
FIG. 11 is a cross-sectional view of a substrate with a diffusion layer and a pn-junction formed.
Figure 12:
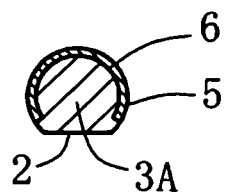
FIG. 12 is a cross-sectional view of the XII-XII line in FIG. 11.
Figure 13:
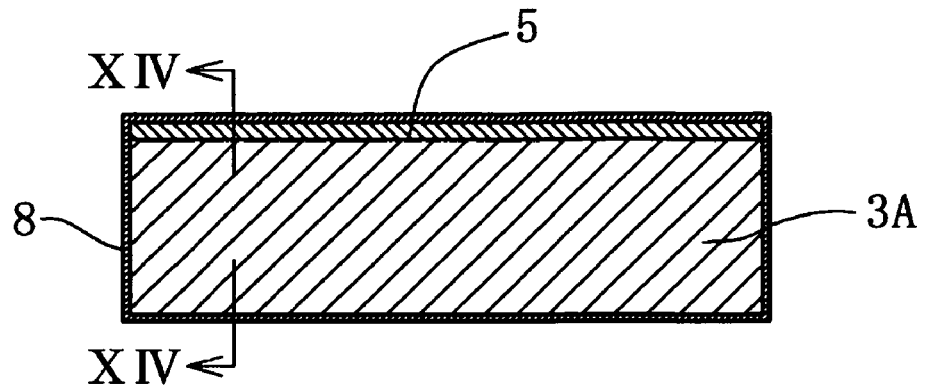
FIG. 13 is a cross-sectional view of a substrate with a diffusion layer, a pn-junction, and an antireflective film formed.
Figure 14:
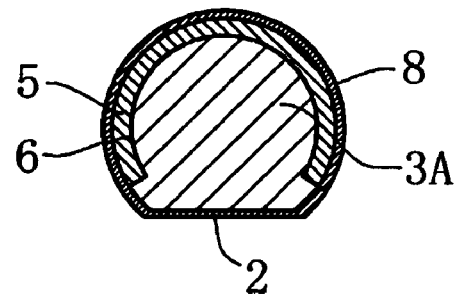
FIG. 14 is a cross-sectional view of the XIV-XIV line in FIG. 13.

Next, as illustrated in FIGS. 11 and 12, the rod-shaped continuous substrate 3 with the n-type diffusion layer 5 and the pn-junction 6 formed is cut into a short columnar body of about 5 mm in length using a cutting device such as a wire saw to make a rod-shaped substrate 3A with the n-type diffusion layer 5 and the pn-junction 6 formed, and an antireflective film 8 and positive and negative electrodes 9A and 10A are installed on this substrate 3A in the following manner. First, as illustrated in FIGS. 13 and 14, as an antireflective film 8 which prevents reflection of light entering from the exterior, an antireflective film 8 made of silicon oxide coating or silicon nitride coating as a passivation film on the silicon surface is formed over the entire surface of the rod-shaped substrate 3A by a publicly-known thermal oxidation method.

Figure 15:
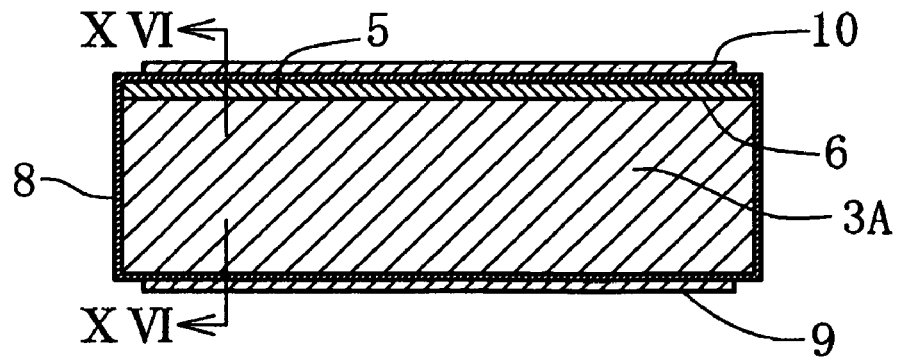
FIG. 15 is a cross-sectional view of a substrate with a diffusion layer, a pn-junction, an antireflective film, and electrode members installed.
Figure 16:
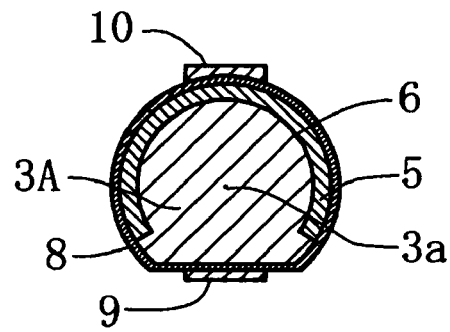
FIG. 16 is a cross-sectional view of the XVI-XVI line in FIG. 15.

Next, as illustrated in FIGS. 15 and 16, a positive electrode member 9 made of paste containing silver is printed in a band shape of about 0.4 mm in width on the surface of the central part of the flat surface 2 of the substrate 3A, and a negative electrode member 10 made of conductive paste containing aluminum is printed in a band shape of about 0.4 mm in width on the apex in the opposite side of the positive electrode member 9 across the axis 3a of the substrate 3A on the surface of the n-type diffusion layer 5.

Next, after drying the positive electrode member 9 and the negative electrode member 10, they are burnt in an inert gas, so that the positive electrode member 9 and the negative electrode member 10 each penetrate the antireflective film 8 to have the positive electrode member 9 form a positive electrode 9A electrically ohmic-connected to the silicon single crystal of the substrate 3A and the negative electrode member 10 form a negative electrode 10A electrically ohmic-connected to the n-type diffusion layer 5. In this manner, a rod-shaped (near-columnar) semiconductor device 20 (solar battery cell) is obtained (see FIGS. 17 and 18). In this semiconductor device 2, the area of the pn-junction 6 is set significantly larger than the cross-sectional area of a cross section perpendicular to the axis 3a of the substrate 3A.

Figure 19:
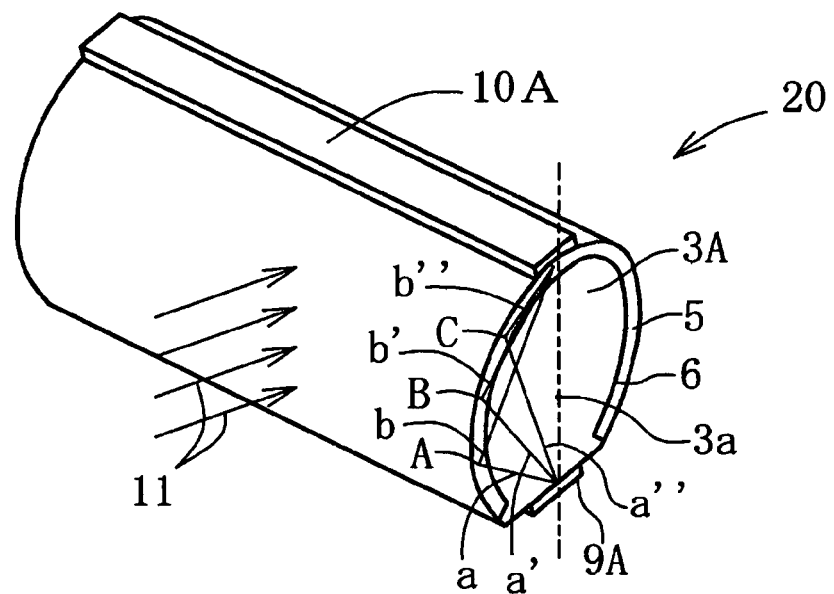
FIG. 19 is a perspective view of a semiconductor device (solar battery cell).

Illustrated in FIG. 19 is a perspective view from above of the semiconductor device 20. The pn-junction 6 is formed in parallel near the near-cylindrical surface of the substrate 3A, the negative electrode 10A is ohmic-connected to the central part in the width direction of the n-type diffusion layer 5, the positive electrode 9A which is placed on the opposite side of the negative electrode 10A across the axis 3a and placed on the central part in the width direction of the flat surface 2 of the substrate 3A is ohmic-connected to a p-type silicon single crystal of the substrate 3A, and the positive electrode 9A and the negative electrode 10A are connected to both ends of the pn-junction 6.

Therefore, when sunlight 11 entering a region of the surface of the semiconductor device 20 excluding the positive electrode 9A and the negative electrode 10A is absorbed by the silicon single crystal constituting the substrate 3A, carriers (electrons and positive holes) are generated, and electrons and positive holes are separated by the pn-junction 6 to generate a photovoltaic power of about 0.5~0.6 V between the positive electrode 9A and the negative electrode 10A.

This semiconductor device 20 has a near-columnar rod shape, the positive and negative electrodes 9A and 10A are positioned on both sides of the axis 3a of the substrate 3A, wherein the positive electrode 9A is positioned in the center of a p-type surface of the flat surface 2, and the negative electrode 10A is positioned in the center of an n-type surface of the diffusion layer 5. Therefore, there is a light-receiving symmetry about a plane connecting the positive and negative electrodes 9A and 10A, and sunlight can be absorbed from both sides of that plane with a wide directivity and a high light-receiving sensitivity. Even if the direction of incident light changes, the light-receiving sensitivity never decreases.

As illustrated in FIG. 19, on an arbitrary plane intersecting perpendicularly with the axis 3a of the substrate 3A, because three different positions A, B, and C along the periphery have almost equal sums to the distances to the positive and negative electrodes 9A and 10A, namely, the distribution of optical current induced by carriers generated in the substrate 3A made of silicon single crystal becomes uniform about the axis 3a of the substrate 3A, which can reduce the resistance loss due to bias. Note that the surface of the pn-junction 6 is protected with an insulating silicon oxide coating 8 on the circumference and the end face intersecting perpendicularly with the axis 3a.

Furthermore, according to this semiconductor device 20, because the band-shaped positive and negative electrodes 9A and 10A are installed opposing each other across the axis 3a on the surface of the rod-shaped substrate 3A, even if the length/diameter ratio of the substrate 3A is increased, the distance between the positive and negative electrodes 9A and 10A can be maintained smaller than the diameter of the substrate 3A, thus the electrical resistance between the positive and negative electrodes 9A and 10A can be maintained at a small value, and the photoelectric conversion performance at the pn-junction 6 can be maintained high.

As a result, in constructing a solar battery panel (or a solar battery module) using a large number of semiconductor devices 20 by increasing the length/diameter ratio of the substrate 3A, the number of electrical connecting parts can be reduced, the reliability of the solar battery panel can be enhanced, and the manufacturing cost can be reduced. Furthermore, because it has a light receiving symmetry about a plane including the positive and negative electrodes 9A and 10A, a solar battery panel which can receive light from both sides of the panel can be constructed.

Because the flat surface 2 is formed on the substrate 3A, the flat surface 2 can be used as a reference surface when manufacturing the semiconductor device 20, the flat surface 2 can prevent the continuous substrate 3 and substrate 3A from rolling, and the positive and negative electrodes 9A and 10A can be easily identified by a sensor of an automatic assembling device for example via the flat surface 2. Then, because the antireflective film 8 is formed on the surface of the semiconductor device 20, reflection of the incident light can be suppressed to increase the light-receiving efficiency, and the antireflective film 8 which also functions as a passivation film can protect the surface of the semiconductor device 20 and secure the durability.

Examples of partially changing said embodiment are explained.
1) Whereas the diameter of the substrate 3A in above described embodiment was 1.8 mm, the diameter of the substrate 3A is not limited to this but may be an arbitrary value of 0.5 mm or larger. In order to save the silicon single crystal raw material, it should desirably be 1.0~2.0 mm.

In addition, whereas the length of the substrate 3A in above described embodiment was 5.0 mm, the length of the substrate 3A is not limited to this but may be about 2~20 times the diameter of the substrate 3A.

However, the area of the pn-junction 6 should be set larger than the area of the cross section perpendicular to the shaft of the substrate 3A.

2) Whereas the width of the flat surface 2 in above described embodiment was 0.6 mm, the width of the flat surface 2 is not limited to this but may be set to about 0.4~0.6 mm. Here, the flat surface 2 formed on the substrate 3A is not indispensable but may be omitted. However, in that case, the positive electrode 9A will come to have the same structure as the negative electrode 10A, wherein the positive and negative electrodes 9A and 10A are positioned symmetrically about the shaft 3a.

3) Whereas the substrate 3A of the semiconductor device 20 (solar battery cell) was made of p-type Si single crystal in this embodiment, it may be made of p-type Si polycrystalline. The separate conductive layer for forming the pn-junction 6 in cooperation with the substrate 3A may be constituted of an n-type conductive layer containing P, Sb, or As. This n-type conductive layer may be formed by thermal diffusion, CVD film formation, or ion injection.

Furthermore, the substrate may be made of n-type Si single crystal or Si polycrystalline. The separate conductive layer for forming the pn-junction 6 in cooperation with the substrate 3A may be constituted of a p-type conductive layer containing p-type impurities Ga, B, and Al. This p-type conductive layer may be formed by thermal diffusion, CVD film formation, or ion injection. Note that the substrate 3A may be made of semiconductor other than Si, a single crystal of Ge, GaSb, GaAs, InP, or SiC, or a multicompound semiconductor containing these.

Embodiment 2

Figure 20:
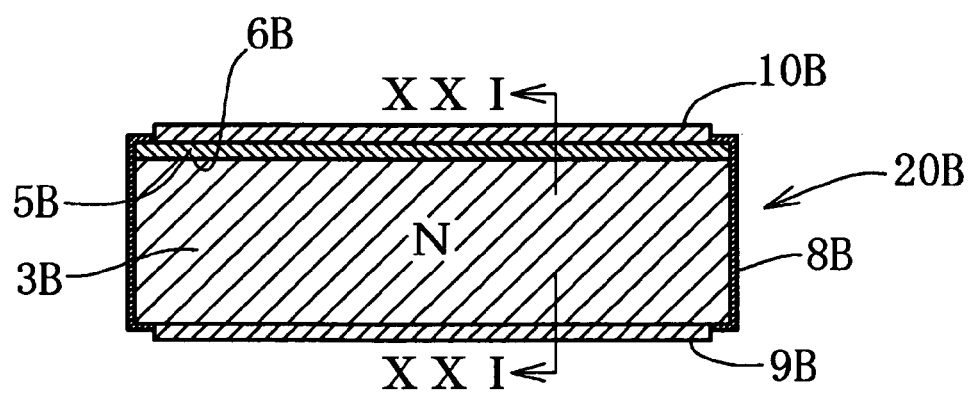
FIG. 20 is a cross-sectional view of a light-emitting semiconductor device of Embodiment 2.
Figure 21:
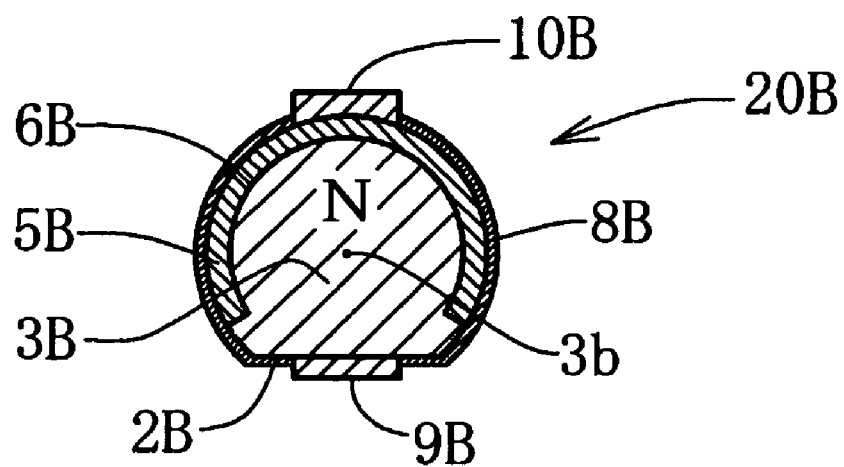
FIG. 21 is a cross-sectional view of the XXI-XXI line in FIG. 20.

A semiconductor device 20B of this Embodiment 2 is a light-emitting diode which has a light-emitting function. As illustrated in FIGS. 20 and 21, this semiconductor device 20B is equipped with a substrate 3B, a flat surface 2B, a diffusion layer 5B, a pn-junction 6B, a negative electrode 9B, a positive electrode 10B, and a passivation coating 8B, constituted of the same structure as the semiconductor device 20 in above described embodiment. The substrate 3B is made of single-crystal or polycrystalline of n-type GaP (gallium phosphide) which is 0.5 mm in diameter and about 5.0 mm in length for example. Note that the diameter only needs to be about 0.5~1.0 mm, and the length is not limited to 5.0 mm, either.

By thermally diffusing zinc (Zn) on the surface layer of the substrate 3B masked with a diffusion mask consisting of a silicon nitride film ($Si_3N_4$) similar to above described diffusion mask 4a, the p-type diffusion layer 5B is formed on the substrate 3B in the same manner as above described diffusion layer 5, and the near-cylindrical (partial cylindrical shape close to a cylinder) pn-junction 68 is formed. The area of this pn-junction 6B is set larger than the area of the cross section perpendicular to the axis of the substrate 3B.

In the same manner as above described antireflective film 8, the passivation coating 8B made of $TiO_2$ for example is formed on the whole surface except the positive and negative electrodes 10B and 9B, and in the same manner as the positive and negative electrodes 9A and 10A of above described embodiment, the positive and negative electrodes 10B and 9B are installed, wherein the negative electrode 9B is positioned in the center of the width direction of the flat surface 2B and electrically ohmic-connected to n-type GaP of the substrate 3B, and the positive electrode 10B is installed on the opposite side of the negative electrode 9B across the axis 3b of the substrate 3B and electrically ohmic-connected to the p-type diffusion layer 5B.

In this light-emitting semiconductor device 20B (light-emitting diode), when a forward electric current is let flow from the positive electrode 10B toward the negative electrode 9B, red light is emitted in the radial direction from the pn-junction 6B at nearly the same intensity. In the same manner as above described semiconductor device 20, it has a light-emitting symmetry about a plane including the positive and negative electrodes 10B and 9B, wherein the generated red light is emitted at an equal emission intensity in the radial direction with a wide directivity. Because the pn-junction has a partial cylindrical shape close to a cylinder, the generated red light passes perpendicularly the surface of the semiconductor element 20B and is emitted to the exterior. Therefore, the internal reflection loss of light is reduced, and the light-emitting efficiency is improved. Then, because the distance between the positive and negative electrodes 10B and 9B can be maintained equal to or smaller than the diameter of the substrate 3B, the electrical resistance between the electrodes 10B and 9B can be maintained low, and a high light-emitting performance can realized.

An example of partially modifying above described semiconductor device 20B is explained below.

It is also possible to construct the above described substrate 3B using various kinds of publicly-known semiconductor materials (For example, GaAs, SiC, GaN, and InP) so that various kinds of light beams are emitted.

A separate conductive layer of a different conduction type from the substrate 3B which forms the pn-junction 6B in cooperation with above described substrate 3B may be formed by thermal diffusion of impurities, CVD film formation, or ion injection.

For example, a light-emitting diode may be constructed by constituting the substrate 3B of an n-type GaAs single crystal and constituting said separate conductive layer of a diffusion layer with Zn thermally diffused.

In addition, a light-emitting diode may be constructed by constituting the substrate 3B of an n-type GaAs single crystal and forming above described separate conductive layer by thermally diffusing, forming a film by CVD of, or ion-injecting p-type GaAs. Also, a light-emitting diode may be constructed by constituting the substrate 3B of an n-type SiC single crystal and forming said separate conductive layer by coating P-type GaN or GaInP.

Embodiment 3

Figure 22:
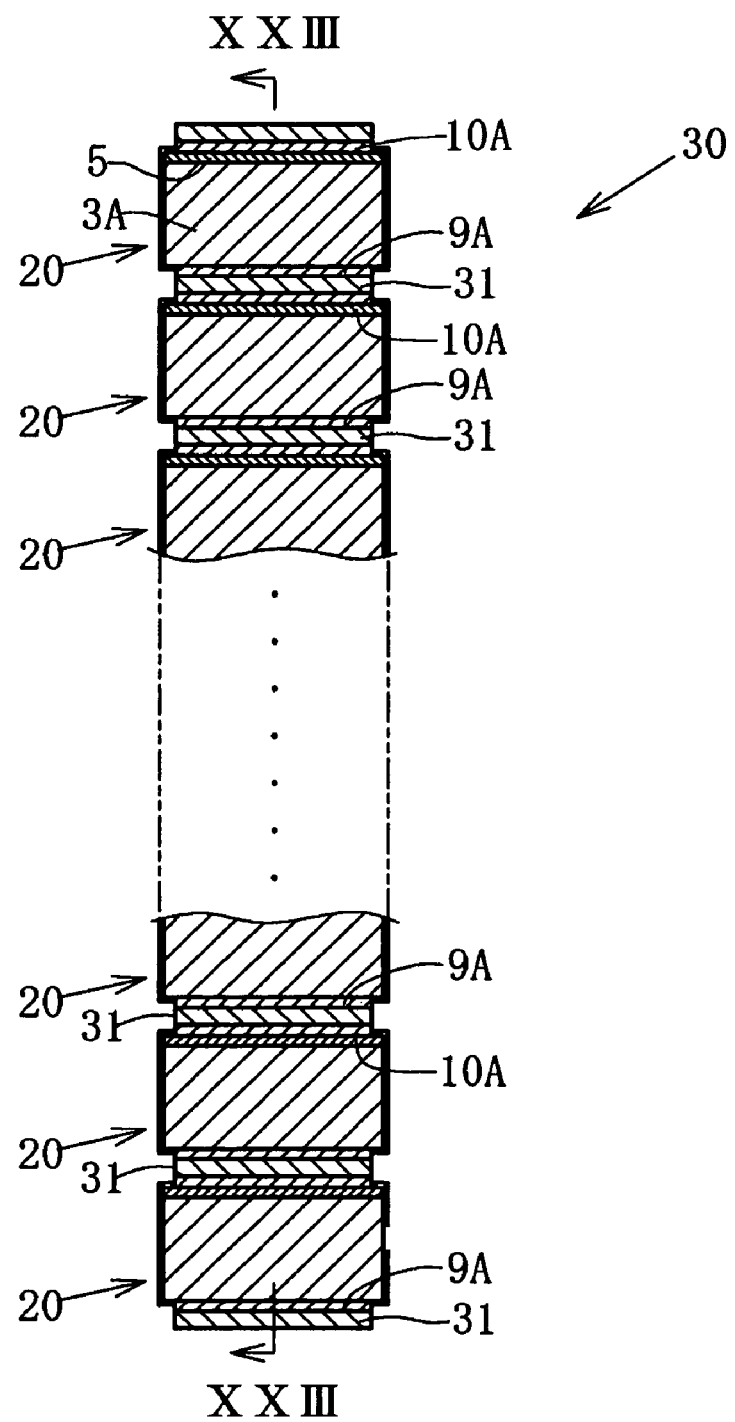
FIG. 22 is a cross-sectional view of a solar battery module of Embodiment 3.
Figure 23:
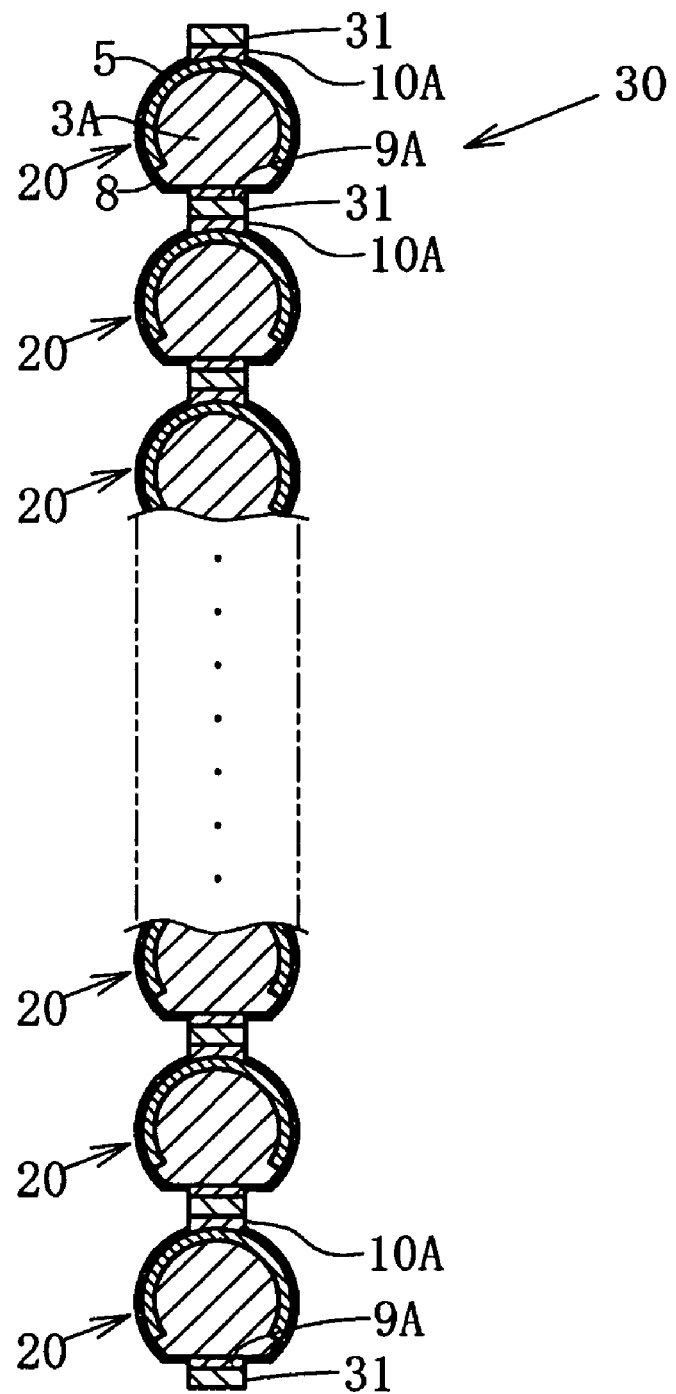
FIG. 23 is a cross-sectional view of the XXIII-XXIII line in FIG. 22.

Illustrated in FIGS. 22 and 23 is a series solar battery module 30 wherein a plurality of above described semiconductor devices 20 (solar battery cells) are connected in series arranged in a planar form with the conduction direction aligned to the column direction. Adjacent positive and negative electrodes 9A and 10A are electrically connected by alloying via a thin-plate bar 31 made of iron-nickel alloy having a thermal expansion coefficient similar to the thermal expansion coefficient of Si single crystal.

For example, the positive and negative electrodes 9A and 10A can be alloyed by interfacing the face joined with the positive electrode 9A with an aluminum film containing 2% Si and the face joined with the negative electrode 10A with a silver film containing 1% antimony in the thin-plate bar 31.

Figure 24:
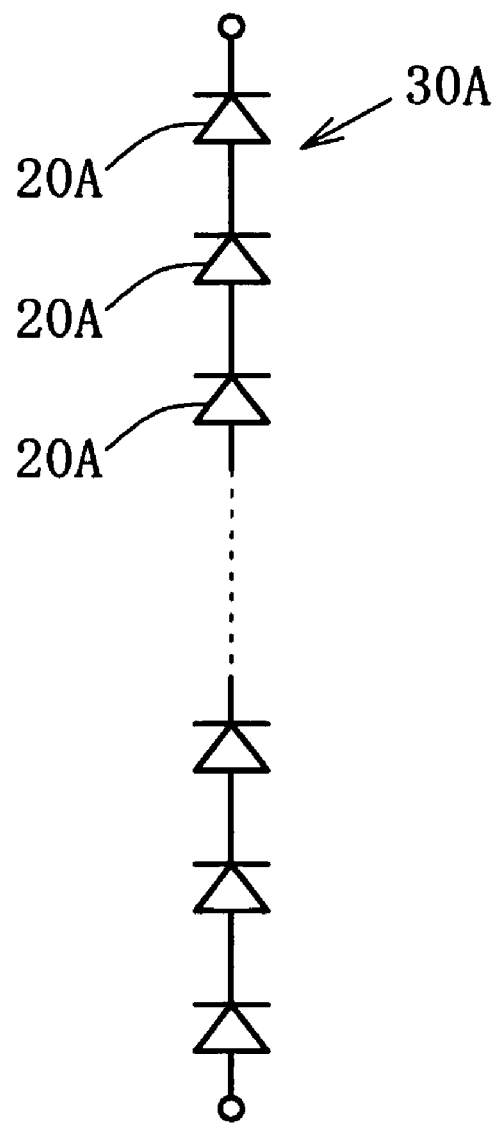
FIG. 24 is an equivalent circuit diagram of the solar battery module in FIG. 22.

In this series solar battery module 30, the output voltage can be increased by increasing the number of solar battery cells connected in series. Sunlight from the front side and sunlight from the back side can be received with a high photoreceptive sensitivity. As illustrated in FIG. 24, an equivalent circuit 30A of this solar battery cell module 30 is a circuit wherein multiple light-receiving diodes 20A corresponding to the semiconductor device 20 (solar battery cell) are connected in series.

Embodiment 4

Figure 25:
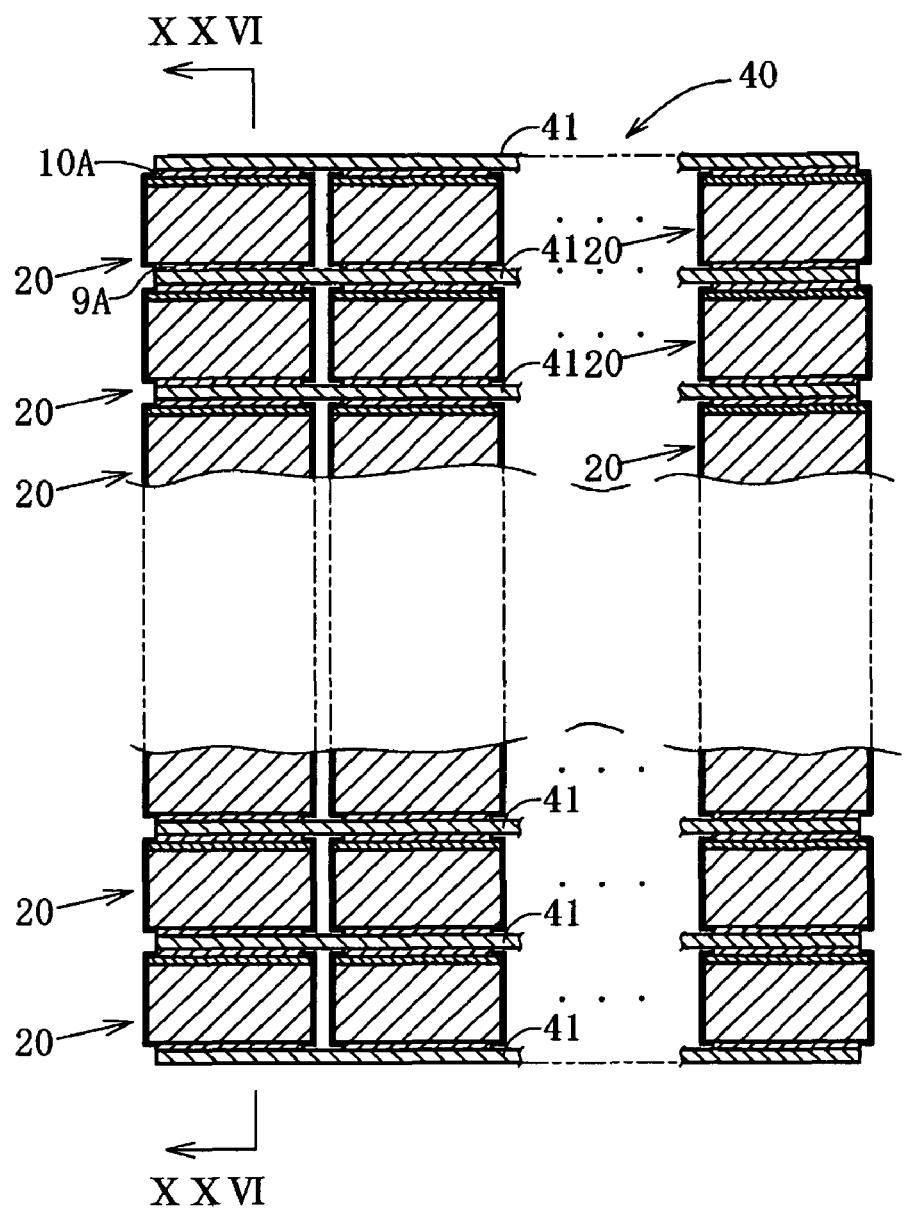
FIG. 25 is a cross-sectional view of a solar battery module of Embodiment 4.
Figure 26:
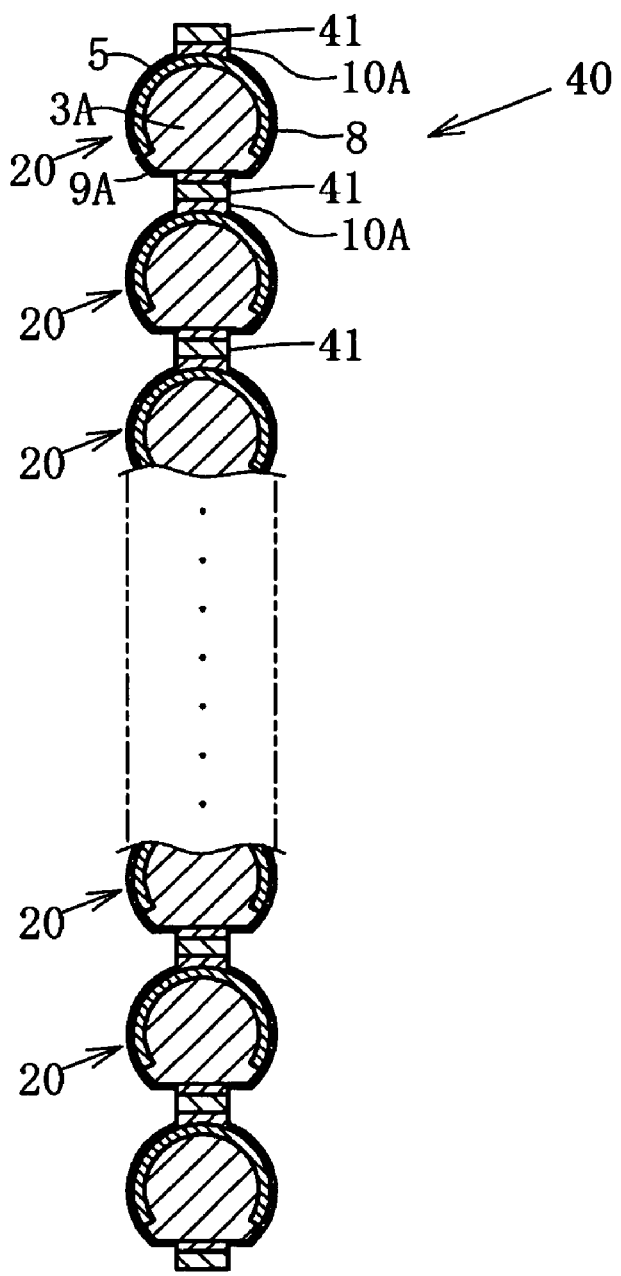
FIG. 26 is a cross-sectional view of the XXV-XXV line in FIG. 24.

Illustrated in FIGS. 25 and 26 is a serial-parallel type solar battery module 40 wherein a plurality of semiconductor devices 20 (solar battery cells) are arranged in a planar matrix form of multiple rows and multiple columns with the conduction direction aligned to the column direction, and these semiconductor devices 20 are connected in series and in parallel. The positive electrodes 9A of multiple solar battery cells in each row and the negative electrodes 10A of multiple solar battery cells 20 in each adjacent row are electrically connected by alloying via a continuous thin-plate bar 41.

In this solar battery module 40, multiple solar battery cells 20 in each column are connected in series via multiple thin-plate bars 41, and multiple solar battery cells 20 in each row are connected in parallel via a pair of thin-plate bars 41 on their both sides. This thin-plate bar 41 is the same as the thin-plate bar 31, joining with the positive and negative electrodes 9A and 10A by the same alloying as mentioned earlier.

Figure 27:
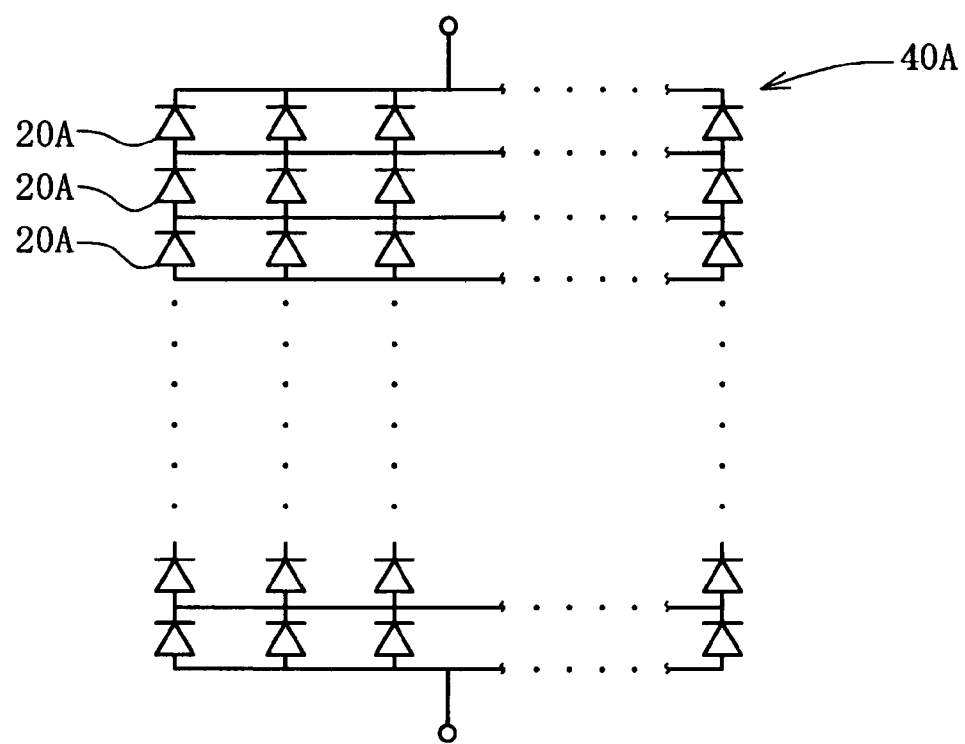
FIG. 27 is an equivalent circuit diagram of the solar battery module in FIG. 25.

The thin-plate bar 41 is also joined with the positive and negative electrodes 9A and 10A of the solar battery cell in the row at one end and the row at the other end for electrically connecting them to an external output wire. As illustrated in FIG. 27, an equivalent circuit 40A of this solar battery module 40 is the one, wherein light-receiving diodes 20A corresponding to the solar battery cells 20 are arranged in a matrix form of multiple rows and multiple columns, connected both in series and in parallel. An output current according to the number of the solar battery cells 20 in the row direction is generated, and an output voltage corresponding to the number of solar battery cells 20 in the column direction is generated.

In this solar battery module 40, because solar battery cells 20 of multiple rows and multiple columns are connected both in series and in parallel, even if a part of solar battery cells 20 stop their power generating function due to breakdown, broken wire, shadow, etc., photocurrent flows bypassing those failed solar battery cells 20, therefore power generating functions of normal solar battery cells 20 will not be lost. Because the solar battery module 40 can receive light from both sides, it is preferably constructed as a solar battery panel embedded in the road sound insulation walls or a fence-shaped solar battery panel.

If this rod-shaped semiconductor device is a solar battery cell, a solar battery panel can be constructed with a large number of the semiconductor devices, and if the rod-shaped semiconductor device has a light-emitting function, it can be utilized as a single light-emitting diode or for making a light-emitting panel comprising multiple semiconductor devices.

What is claimed is:

1. A rod-shaped semiconductor device having a light-receiving or light-emitting function; wherein said rod-shaped semiconductor device comprises,
    a rod-shaped substrate made of p-type or n-type semiconductor crystal having a circular of near-circular cross section and extending in an axial direction perpendicular to said cross section,
    a separate conductive layer which is formed on a part of a surface of said substrate, excluding a band-shaped part spanning in a first dimension a circumferential arc at a periphery of the cross section, the excluded band-shaped part extending in the axial direction in a second dimension perpendicular to the first dimension for a length along said surface, said separate conductive layer having a different conduction type from that of said substrate,
    a near-cylindrical pn-junction formed with said substrate and said separate conductive layer,
    a band-shaped first electrode ohmic-connected to a surface of said band-shaped part of said substrate, said first electrode spanning in the first dimension at least a portion of said circumferential arc and extending in the axial direction in the second dimension along said length of the band-shaped part, and
    a band-shaped second electrode ohmic-connected to a surface of said separate conductive layer spanning in one dimension a circumferential arc at a periphery of separate conductive layer peripheral to said cross section, said second electrode extending in the axial direction in said second dimension perpendicular to said one dimension for a length along said separate conductive layer, wherein the first electrode and the second electrode are circumferentially at opposite positions of said cross section.

2. A semiconductor device module, comprising a plurality of rod-shaped semiconductor devices arranged in a planar matrix and connected in series and in parallel, the matrix having a plurality of rows and a plurality of columns of rod-shaped semiconductor devices, each one of the plurality of rod-shaped semiconductor devices having a light-receiving or light-emitting function and comprising:
    a rode-shaped substrate made of a p-type or n-type semiconductor crystal having a circular or near-circular cross section;
    a separate conductive layer, which is formed on a part of a surface of said substrate excluding a band-shaped part parallel to an axis of said substrate, and which has a different conduction type from that of said substrate;
    a near-cylindrical pn-junction formed with said substrate and said separate conductive layer;
    a band-shaped first electrode ohmic-connected to a surface of said band-shaped part on a circumferential surface side of said substrate; and
    a band-shaped second electrode ohmic-connected to a surface of said separate conductive layer on an opposite side of said first electrode across the axis of said substrate;
    wherein for each one of said plurality of rod-shaped semiconductor devices, said first electrode is one of a positive or negative electrode and said second electrode is the other of a positive or negative electrode;
    wherein for each two adjacent serially connected rod-shaped semiconductor devices in any given column of the planar matrix, a positive electrode of one rod-shaped semiconductor device is electrically connected to an adjacent negative electrode of an adjacent rod-shaped semiconductor device by an electrically connecting thin plate; and
    wherein for any given row of the planar matrix, all rod-shaped semiconductor devices in said given row are connected in parallel by a pair of thin plates, at least on thin plate among said pair of parallel connecting thin plates also serving as the electrically connecting thin plate for respective serial connections between respective rod-shaped semiconductor devices in said given row and corresponding adjacent rod-shaped semiconductor devices in an adjacent row.

3. The semiconductor device module of claim 2, wherein each thin plate comprises an iron-nickel alloy having a thermal expansion coefficient similar to that of a silicon single crystal.

4. The semiconductor device module of claim 2, wherein each thin plate comprises an aluminum-silicon film at a face contacting the positive electrode, and comprises a silver-antimony film at a face contacting the negative electrode.

5. The semiconductor device module of claim 2, wherein said substrate comprises an n-type GaP single crystal or GaAs single crystal, and said separate conductive layer comprises an n-type diffusion layer with Zn thermally diffused.

6. The semiconductor device module of claim 2, wherein said substrate comprises an n-type GaAs single crystal, and said separate conductive layer is formed by diffusing, forming a film of, or ion-injecting a p-type GaAs.

7. The semiconductor device module of claim 2, wherein said substrate comprises an n-type SiC single crystal, and said separate conductive layer is formed by making a p-type GaN or GaInP film.

8. The semiconductor device module of claim 2, wherein for said each one of the plurality of rod-shaped semiconductor devices an antireflective film is formed on a part of a surface of said substrate and separate conductive layer excluding said first and second electrodes.

9. The semiconductor device module of claim 2, wherein for said each one of the plurality of rod-shaped semiconductor devices said substrate is made of p-type Si single crystal or Si polycrystalline, and said separate conductive layer comprises an n-type conductive layer containing P, Sb, or As.

10. The semiconductor device module of claim 2, wherein for said each one of the plurality of rod-shaped semiconductor devices said substrate is made of n-type Si single crystal or Si polycrystalline, and said separate conductive layer comprises a p-type conductive layer containing P, Sb, or As.

11. The semiconductor device module of claim 2, wherein for each one rod-shaped semiconductor device of said plurality of rod-shaped semiconductor devices, said band-shaped first electrode extends axially along a sidewall of said one rod-shaped semiconductor device at the surface of said band-shaped part, wherein said band-shaped second electrode extends axially along the sidewall of said one rod-shaped semiconductor device at the surface of the separate conductive layer, and wherein said band-shaped first electrode and said band-shaped second electrode are circumferentially located at opposite portions, cross-sectionally, of said one rod-shaped semiconductor device.

\* \* \* \* \*